(12) United States Patent  (10) Patent No.: US 8,647,722 B2
Kobayashi et al.  (45) Date of Patent: Feb. 11, 2014

(54) METHOD OF FORMING INSULATION FILM USING PLASMA TREATMENT CYCLES

(75) Inventors: Akiko Kobayashi, Tokyo (JP); Akira Shimizu, Tokyo (JP); Kuo-wei Hong, Tokyo (JP); Nobuyoshi Kobayashi, Tokyo (JP); Atsuki Fukazawa, Tama (JP)

(73) Assignee: ASM Japan K.K., Tokyo (JP)

( * ) Notice: Subject to any disclaimer, the term of this patent is extended or adjusted under 35 U.S.C. 154(b) by 383 days.

(21) Appl. No.: 12/618,419

(22) Filed: Nov. 13, 2009

(65) Prior Publication Data

US 2010/0124618 A1 May 20, 2010

Related U.S. Application Data

(60) Provisional application No. 61/114,879, filed on Nov. 14, 2008.

(51) Int. Cl.
*H05H 1/24* (2006.01)
(52) U.S. Cl.
USPC ............................................. 427/569

(58) Field of Classification Search
USPC ............................................. 427/569
See application file for complete search history.

(56) References Cited

U.S. PATENT DOCUMENTS

| 6,194,037 | B1 * | 2/2001 | Terasaki et al. ............ 427/569 |
| 6,756,318 | B2 | 6/2004 | Nguyen et al. |
| 6,953,609 | B2 * | 10/2005 | Carollo ..................... 427/579 |
| 7,163,721 | B2 | 1/2007 | Zhang et al. |
| 7,498,242 | B2 | 3/2009 | Kumar et al. |
| 2006/0269692 | A1 * | 11/2006 | Balseanu et al. ............ 427/569 |

FOREIGN PATENT DOCUMENTS

| WO | 2006054854 | 5/2006 |
| WO | 2006080782 | 8/2006 |
| WO | WO 2006080782 A1 * | 8/2006 |

* cited by examiner

*Primary Examiner* — Kelly M Gambetta
(74) *Attorney, Agent, or Firm* — Snell & Wilmer L.L.P.

(57) ABSTRACT

A film forming cycle based on pulse CVD or ALD is repeated multiple times to form a single layer of insulation film, while a reforming cycle is implemented in the aforementioned process, either once or multiple times per each film forming cycle, by treating the surface of formed film using a treating gas that has been activated by a plasma.

18 Claims, 6 Drawing Sheets

(a)

(b)

METHOD OF FORMING INSULATION FILM USING PLASMA TREATMENT CYCLES

CROSS REFERENCE TO RELATED APPLICATIONS

This application claims the benefit of U.S. Provisional Application No. 61/114,879, filed Nov. 14, 2008, and the disclosure of which is herein incorporated by reference in its entirety.

BACKGROUND

1. Field of the Invention

The present invention generally relates to a method of forming an insulation film by pulse plasma chemical vapor deposition (pulse CVD) or atomic layer deposition (ALD).

2. Description of the Related Art

SiN films used as gate spacers must offer a good coverage and have an etch rate equivalent to or less than thermal oxide films. A general rule of thumb is that the lower the film forming temperature, the better the coverage. However, films formed at low temperature present a problem in that they have a very high wet etching rate (WER). For example, a sequence based on the conventional pulse CVD is shown in FIG. 1(a). A similar pattern is also seen when ALD is used.

SUMMARY

In an embodiment of the present invention, on the other hand, a reforming cycle is implemented after the film forming cycle, as shown in the sequence in an embodiment illustrated in FIG. 1(b). In a representative embodiment of the present invention, a treating gas (reforming gas) that has been activated by a plasma is applied, after the film forming cycle, to treat the surface of film (reforming treatment method). Particularly at low temperatures (500° C. or below, or preferably 350° C. or below), this reforming cycle can be performed for every several film forming cycles (also can be performed for every cycle), with the reforming cycle repeated multiple times at a constant or varying frequency until the target film thickness (such as 25 nm) is achieved, in order to improve the film quality at low temperatures. The frequency of this reforming cycle may be change as the deposition of film progresses, or the frequency may be kept constant all the way until the end. In the above, the reforming cycle only reforms the surface of film, and there is virtually no deposition of film during this cycle. Therefore, even though the reforming cycle is implemented, the film thickness substantially does not increase (the increase of film thickness is 10% or less at most, normally 5% or less, and in some embodiments 2% or less, compared to no reforming cycle process). The reforming cycle used with ALD or pulse CVD. However, neither of them requires a reforming cycle for film formation, since film growth and deposition occur whether or not the reforming cycle is implemented. In the reforming cycle, material gas is not introduced; rather the reforming gas is introduced and RF is applied. Typically, ALD comprises a process of precursor adsorption and a reaction process with a reactant; the film thickness is substantially determined in the process of precursor adsorption, and the film thickness is not substantially changed in the reaction process with a reactant. However, this reaction process with a reactant is essential for film formation, and the reaction process is the first one that changes the adsorbed precursor to a film-forming substance. The reaction process with a reactant is used on a non-film layer. In contrast, the reforming process is used on a film-forming layer. In pulse CVD, film-forming substances are produced in the gas phase and deposited, forming film on the surface of a substrate; therefore, there is no reaction process with a reactant as in ALD.

In a representative example of the present invention, a film of good film quality (low WER) can be formed at low temperatures while maintaining a good coverage.

In an embodiment, a method of forming a film comprises: (i) forming a layer of insulation film composed of multiple sub-layers of film on a substrate, each sub-layer being formed by a film-forming cycle based on plasma enhanced CVD (e.g., pulsed PECVD), thermal ALD, or plasma enhanced ALD; and (ii) treating a surface of one or more of the multiple sub-layers of film on the substrate by a reforming cycle using a reforming gas excited by a plasma, wherein the reforming cycle is implemented between consecutive film-forming cycles either once or multiple times until the layer of insulation film is formed. The sub-layer refers to a layer or layers formed by one film-forming cycle.

In some embodiments, a purge cycle is provided between the film forming cycle and the reforming cycle in sequence.

In some embodiments, a duration of each reforming cycle is 1 to 10 seconds.

In some embodiments, in the reforming cycle, substantially no film is formed on the sub-layer.

In some embodiments, the reforming gas is constituted by one or more types of gases selected from the group consisting of $H_2$, $NH_3$, $O_2$, $N_2O$, $CO_2$, Ar, Xe, and $N_2$.

In some embodiments, the insulation film is constituted by a silicon compound.

In this disclosure, "gas" may include vaporized solid and/or liquid and may be constituted by a mixture of gases. In this disclosure, the precursor, the reactant gas, and the rare gas may be different from each other or mutually exclusive in terms of gas types, i.e., there is no overlap of gases among these categories. Further, in this disclosure, any ranges indicated may include or exclude the endpoints. In this disclosure, "film" may refer to a fixed film having a certain thickness such as a film fixed by a reactant in ALD, a film formed by CVD, and an integrated film comprised of one or more films, on which fixed film another film can be formed.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION

Figure 1:
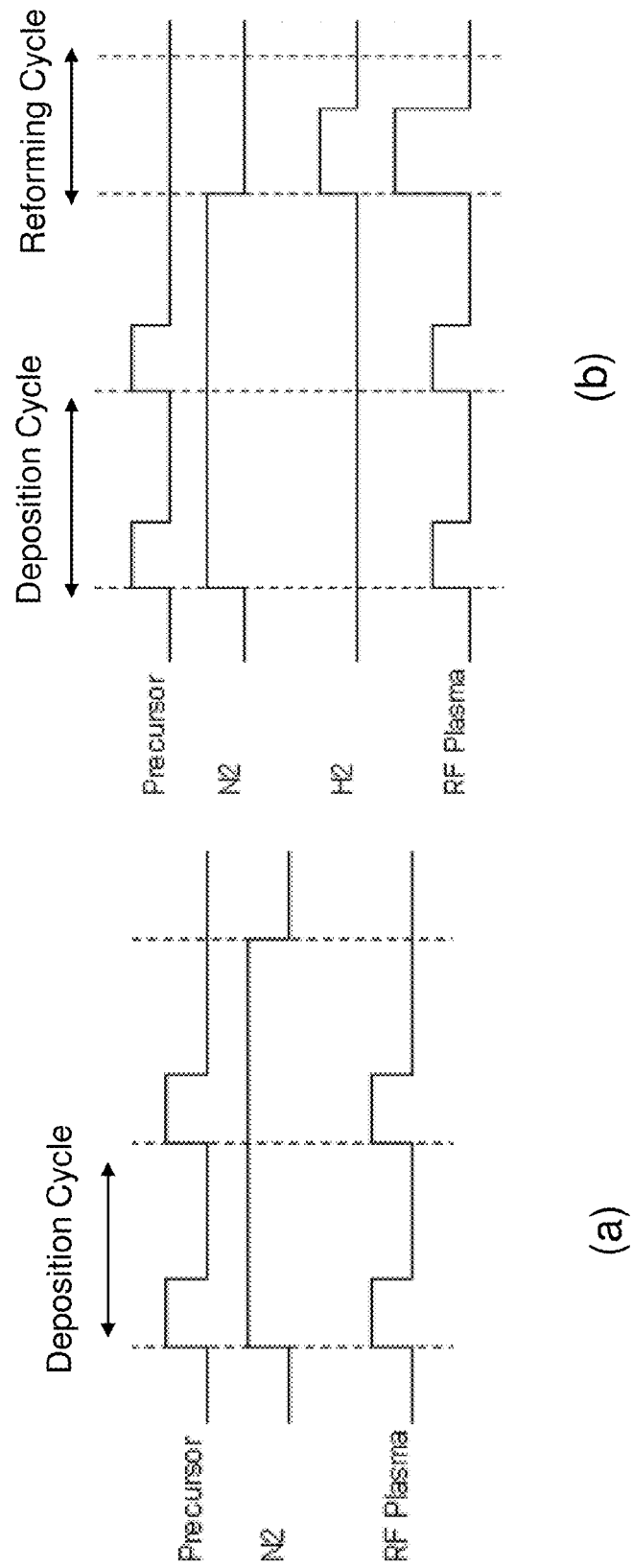
FIG. 1(a) shows a deposition cycle according to a conventional method.
FIG. 1(b) shows a deposition cycle and a reforming cycle according to an embodiment of the present invention.

The embodiments presented herein include those specified below. It should be noted, however, that the present invention is not at all limited to these embodiments:

1) A method of forming a film, wherein said method is characterized in that a film forming cycle based on pulse PECVD, ALD or PEALD is repeated multiple times to form a single layer of insulation film, while a reforming cycle is implemented in the aforementioned process, either once or multiple times per each film forming cycle, by treating the surface of formed film using a treating gas that has been activated by a plasma.

2) A method according to 1), wherein a purge cycle is provided between the film forming cycle and reforming cycle.

3) A method according to 1) or 2), wherein the treating gas is constituted by one or more types of gases selected from the group that includes one or more type of $H_2$, $NH_3$, $O_2$, $N_2O$, $CO_2$, Ar, Xe and $N_2$.

4) A method according to any one of 1) to 3), wherein the insulation film is constituted by a silicon compound.

5) A method according to 3), wherein the insulation film is SiO, SiN, SiCN, SiC, SiON, SiOCN, SiCN, SiBN or SiBO.

6) A method according to any one of 1) to 5), wherein the precursor supplied in the film forming cycle based on pulse PECVD, ALD or PEALD is one type of material, or two or more types of materials combined together, selected from the group that includes materials belonging to the aminosilane or organic silane group.

7) A method according to any one of 1) to 6), wherein a plasma is generated in the reforming cycle through application of radio frequency waves to the gap between the parallel plate electrodes.

8) A method according to any one of 1) to 7), wherein a plasma is generated, in the film forming cycle and reforming cycle, through said application to the shower head that supplies gas.

9) A method according to any one of 1) to 8), wherein two different plasma frequencies are applied.

10) A method according to any one of 1) to 9), wherein the film forming cycle is based on plasma ALD.

11) A method according to any one of 1) to 9), wherein the film forming cycle is based on thermal ALD.

12) A method according to any one of 1) to 9), wherein the film forming cycle is based on pulse CVD.

In the embodiment of 1) above, it is appropriate to adjust the frequency of reforming cycle typically to 5 nm or less, or preferably to 1 nm or less, in thickness of formed film. For example, it is appropriate to implement the reforming cycle once every five film forming cycles or less if the ALD film forming method is used and 0.2 nm of film is formed in each film forming cycle. This is because the thicker the film to be reformed, the longer the reforming time becomes.

Representative conditions of the reforming cycle in the embodiment in 1) above are (although are not limited thereto), for example, treating gas (for example $H_2$) flow rate range of approx. 100 to 2000 sccm (preferably 100-500 sccm), range of treating time (reforming treatment; where the treating gas supply and RF application overlap) of approx. 1 to 10 see (preferably 1-3 see), pressure range of approx. 50 to 2000 Pa (preferably 100-800 Pa), and RF power range of approx. 100 to 1000 W (preferably 100-500 W), Also, preferably the RF application for reforming is stronger (e.g., 1.5 to 3 times higher) than the RF application for film forming in pulse CVD and the RF application for reaction process in ALD. The temperature is approx. 0-600° C. (preferably 200-550° C.).

When the film forming cycle is compared with the reforming cycle in the above embodiments, the pressure and temperature are typically the same in some embodiments. Changing the temperature and pressure reduces the throughput.

In the embodiments of 1), 8) and 10) above, the RF power range applicable to a plasma used in the film forming cycle varies depending on the film to be formed. If plasma CVD is used, however, the RF power is typically in a range of approx. 10 to 2000 W (preferably 20-100 W).

In an embodiment, the duration of one film forming cycle is approx. 0.1 to 10 sec (preferably 1-5 sec) in the case of pulse CVD, or approx. 2 to 10 sec (preferably 1-5 sec) in the case of ALD.

In an embodiment, the thickness of film typically deposited in one film forming cycle is approx. 0.5 to 5 nm (preferably 1-3 nm) in the case of pulse CVD, or approx. 0.3 nm or less (preferably 0.1-0.3 nm) in the case of ALD.

In the embodiment of 2) above, the gases typically present in the purge cycle are primarily inert gases free from material gases, or they may contain treating gases. The flow rate range of purge gas is approx. 100 to 3000 sccm (preferably 100-1000 sccm), processing time is approx. 0 to 5 sec (preferably 0-2 sec), and pressure is approx. 50 to 2000 Pa (preferably 100-800 Pa), and evacuation is not typically performed after the purge. A duration of the purge process, which is conducted between the film forming process and the reforming treatment process, is typically 0-5 sec (preferably 0-2 sec), but the purge process can be omitted (0 sec).

In the embodiment of 2) above, conversely purge may be performed in the same manner between the plasma treatment process using reactant gas and the precursor adsorption process.

In the embodiment of 7) above, the radio frequency range is approx. 400 Hz to 3 GHz (preferably 10-30 MHz).

In the embodiment of 9) above, a combination of two different plasma frequencies, for example, 10-30 kHz and 0.2-1 MHz, can be applied in film-forming cycle and/or reforming cycle.

In an embodiment of the present invention, film forming materials belonging to the aminosilane group such as HEAD ($Si_2[NHC_2H_6]_6$), 3DMASCl ($Si[N(CH_3)_2]_3Cl$), 3EMAS ($H_2Si[N(C_2H_5)CH_3]_3$), 4DMAS ($Si[N(C_2H_6)_2]_4$), 4DEAS ($Si[N(C_2H_6)_2]_4$), etc., can be used favorably. 4MS (($CH_3)_4SiH_3$), 2ES (($C_2H_5)_2SiH_2$), phenyl-$SiH_3$, cyclohexyl-$SH_3$ and other materials belonging to the organic silane group can also be used. Other materials that can be used include $SiH_4$, $Si_2H_6$, TSA ($[SiH_3]_3N$), HCDS ($Si_2Cl_6$), $Si_3H_8$, TICS ($Si[NCO]_4$), TBOS ($Si[OtBu]_3OH$), TDMHyS ($Si[NHMe_2]_4$), etc. In the above, any one type of film forming material may be used alone, or two or more types of materials may be combined together.

In an embodiment of the present invention, the treating gas may be $N_2$, $H_2$, $O_2$, $NH_3$, $CH_3$, $CO$, $C_2H_6$, $CO_2$, $N_2O$, Ar, Xe, $B_2H_6$, etc. (any one type selected from the foregoing may be used alone, or two or more types may be combined together), to form such films as SiN, SiO, SiON, SiCN, SiOCN, SiCON, SiBN, SiBO, etc.

Figure 5:
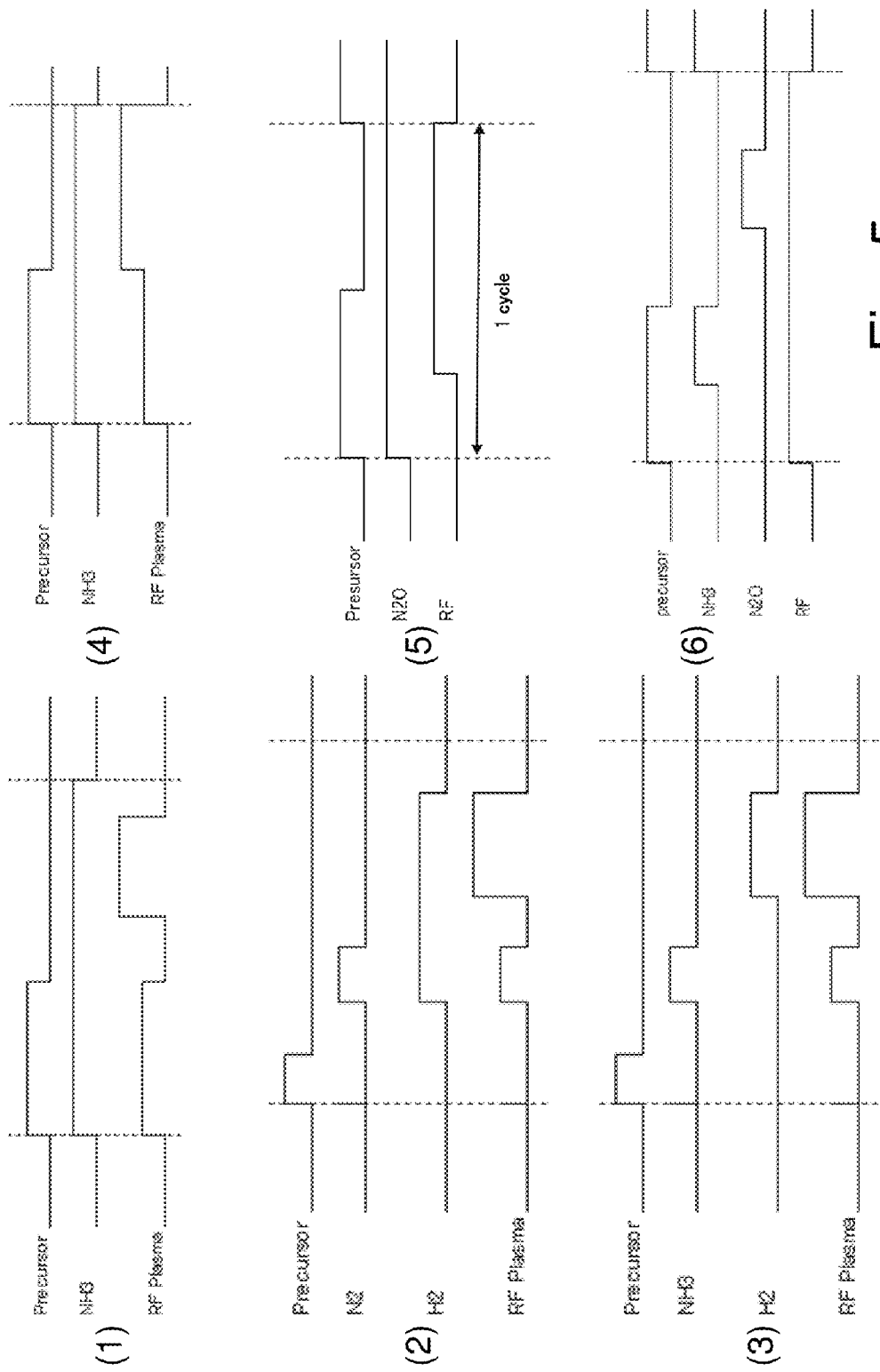
FIG. 5 shows modified film formation cycles according to embodiments (1) to (6) of the present invention.
Figure 6:
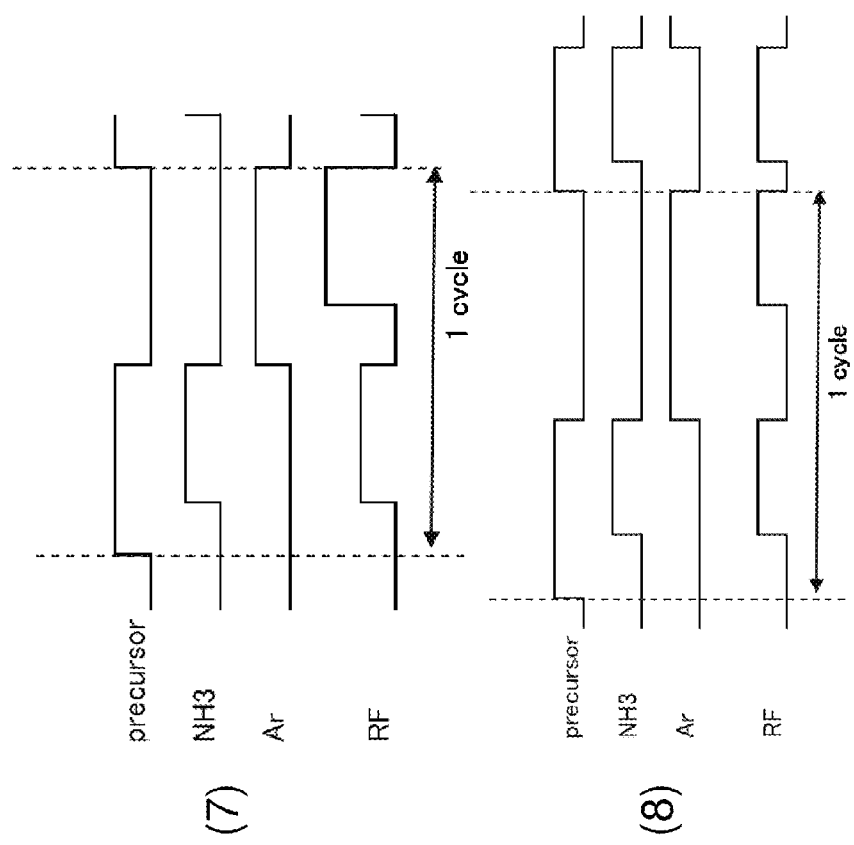
FIG. 6 shows modified film formation cycles according to embodiments (7) and (8) of the present invention.

Sequences in other embodiments are shown in FIG. 5 (1) to (6) and FIG. 6 (7), (8).

(1) Pulse CVD: treating gas and CVD reactant gas: $NH_3$; the reforming RF application is stronger than the film-forming RF application (cycle frequency=1:1; "cycle frequency=1:x" refers to x times of reforming cycle per one time of film-forming cycle).

(2) ALD deposition process: supplying the reforming gas and the reactant gas begins at the same time; the reforming RF application is stronger than the reactant RF application (cycle frequency=1:1).

(3) ALD deposition process: the reforming gas and reforming RF application are in the same pulse; the reforming RF application is stronger than the reactant RF application (cycle frequency=1:1).

(4) No-purge process; the reforming gas and the reactant gas are the same and continuously supplied; the RF is continuously applied and the reforming RF application is stronger than the film-forming RF application (cycle frequency=1:1).

(5) Pulse CVD: the reforming gas and the reactant gas are the same and continuously supplied; continuous RF application starts in the middle of the deposition process and continues through the reforming process (cycle frequency=1:1).

(6) Pulse CVD: continuous and constant RF application, and reforming gas pulse (cycle frequency=1:1).

(7) Pulse CVD: reforming gas pulse, and RF application pulse; reforming RF application is stronger than film-forming RF application (cycle frequency=1:1).

(8) Pulse CVD: reforming gas pulse, and RF application pulse; reforming RF application and film-forming RF application are at the same level (cycle frequency=1:1).

The cycle frequency can be changed in a range of 1:1 to 1:10 (e.g., 1:2 to 1:5) in some embodiments.

Additionally, not mentioned in the figures, the reforming cycle can be performed upon the formation of film in ALD, where a plasma is applied in the material adsorption process, increasing the amount of material adsorbed on the surface and improving the film growth rate (for example, the process disclosed in U.S. Provisional Application No. 61/114,847, the disclosure of which is herein incorporated by reference in its entirety), in the same or similar manner to the case where no plasma is applied in the material adsorption process.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in specific embodiments can be modified by a range of at least ±50% in other embodiments, and the ranges applied in embodiments may include or exclude the endpoints.

EXAMPLES

Example 1

Figure 2:
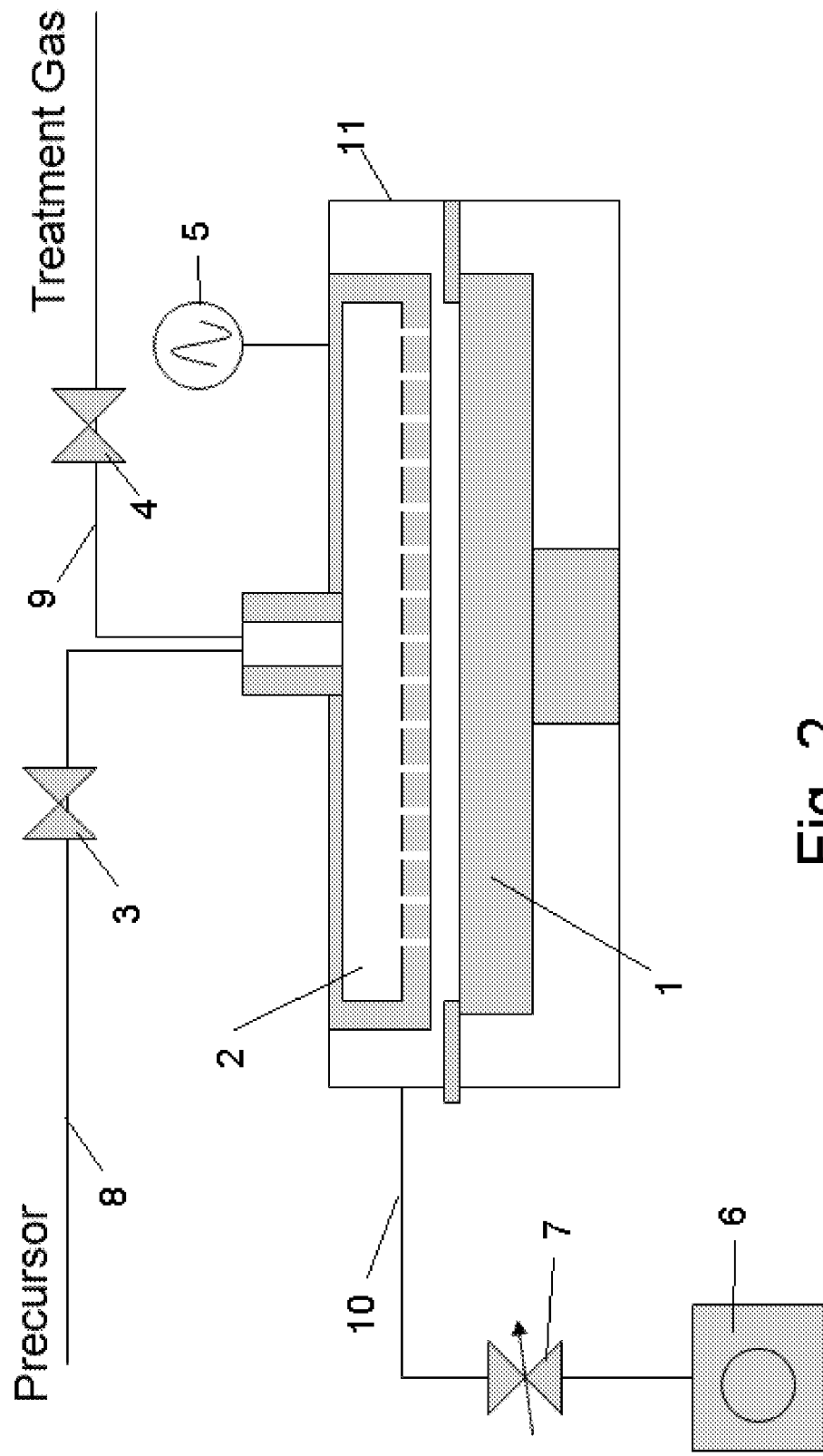
FIG. 2 is a schematic view of an apparatus useable in an embodiment of the present invention.

In this example, the apparatus shown in the schematic diagram of FIG. 2 was used to form a film. This apparatus comprises a reactor 11 which can be retained in a vacuum state, susceptor 1 with heating mechanism used to hold a wafer on top, shower head 2 which provides a mechanism for supplying gas, RF application mechanism 5 that generates a plasma between the shower head and susceptor, the material gas supply line equipped with an open/close valve 3 connected to the shower head 2, treating gas supply line 9 equipped with another open/close valve 4, exhaust line 10 used to exhaust the atmosphere inside the reactor 11, and vacuum pump 6 connected after the exhaust line via a pressure control valve 7, among others. Note that a purge gas line (not illustrated) is also connected to the shower head 2 just like the reactant gas supply line 9.

A Si wafer (300 mm in diameter) was heated to 200° C., and then (a) 3DMAS $SiH[NMe_2]_3$, $N_2$ and $H_2$ were supplied and RF was applied, after which this condition was retained for 3 sec and then (b) RF was turned off and the supply of material gas was stopped. For a specific number of cycles by which the process of depositing film by repeating (a) and (b) (film forming cycle: pressure 400 Pa) was repeated, say, for two cycles of the deposition process, one cycle of a process of introducing $H_2$ being the treating gas and applying RF to reform the film (reforming cycle: temperature 200° C., pressure 400 Pa) was inserted for 2 sec. In addition, Ar was introduced (by 1000 sccm) as the carrier gas and purge gas, and the reactor pressure was adjusted to approx. 400 Pa. The carrier gas for 3DMAS material was supplied by 300 sccm, $N_2$ by 500 sccm, and $H_2$ by 300 sccm (the flow rates were the same in the film forming cycle and reforming cycle). RF (13.56 MHz) was applied by 100 W in the deposition process and by 500 W in the treating gas supply process. As a comparative example, an operation similar to the above, but without the reforming process, was performed. In the above, the film forming cycle was repeated 100 times and the achieved film was 25-nm thick.

Figure 3:
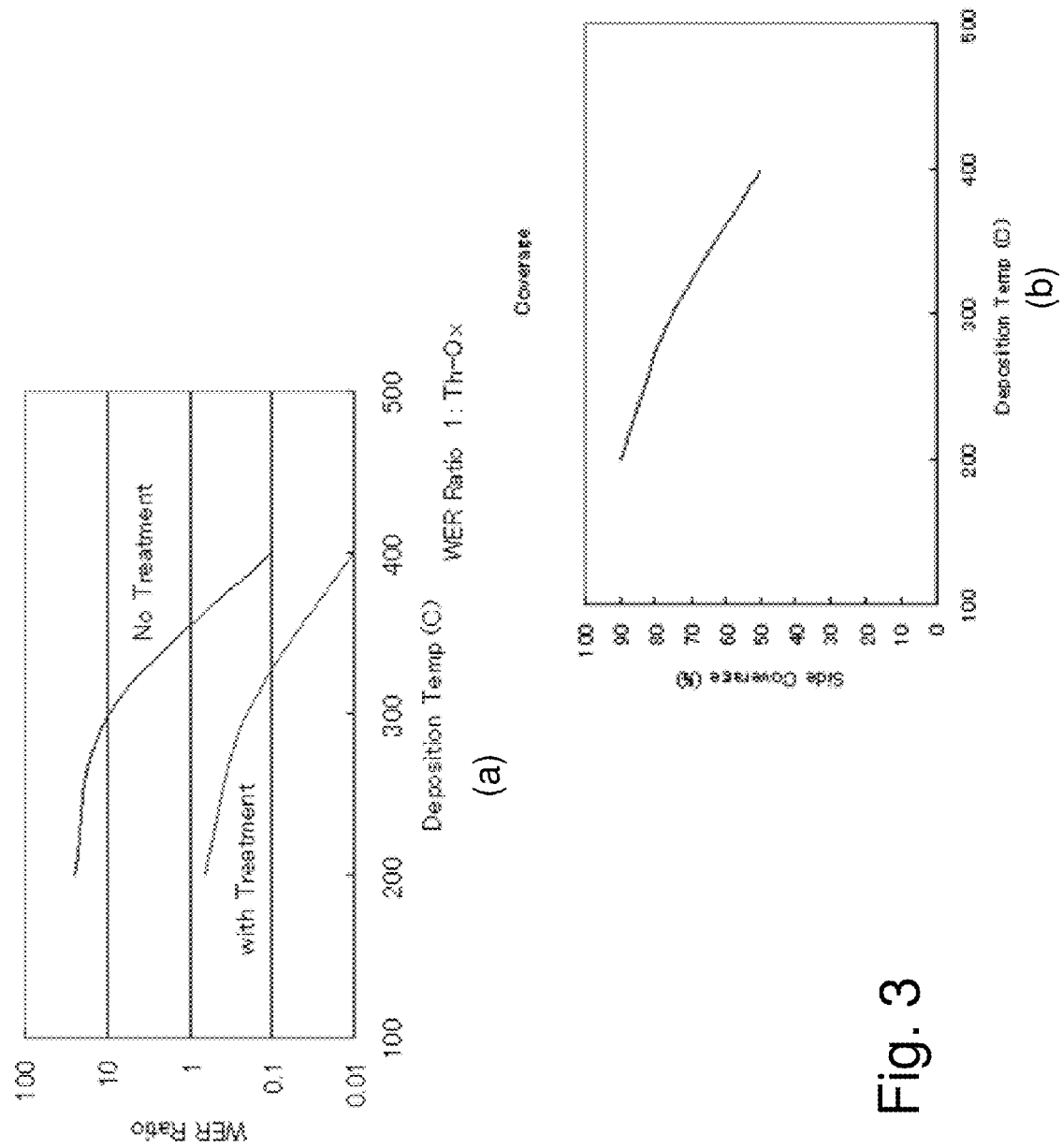
FIG. 3(a) is a graph showing the relationship between wafer edge rate relative to thermal oxide film and deposition temperature according to an embodiment of the present invention (marked "with Treatment") and according to a comparative method (marked "No Treatment").
FIG. 3(b) is a graph showing the relationship between side coverage (a ratio of film thickness on the side wall of a trench to film thickness on the top surface) and deposition temperature according to an embodiment of the present invention.
Figure 4:
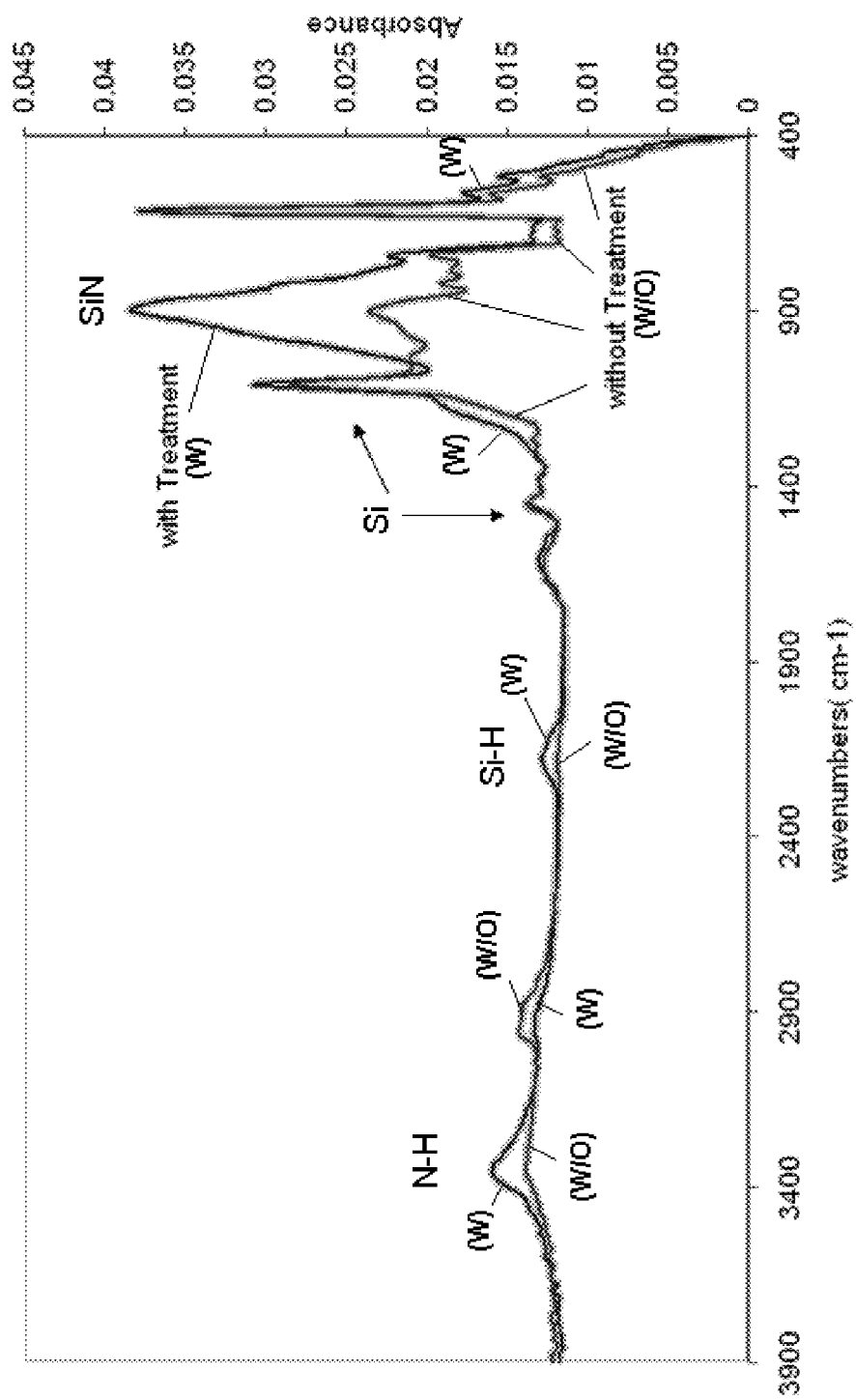
FIG. 4 is an FTIR chart of a film obtained according to an embodiment of the present invention (marked "with Treatment") and a film obtained according to a comparative method (marked "without Treatment").

FIG. 1(a) shows the sequence in the comparative example (pulse PECVD), while FIG. 1(b) shows the sequence in the present example. Also, FIG. 3(a) shows the results of checking the wet etch rates (WER) of each film obtained by changing the film forming temperature, while FIG. 3(b) shows the results of checking the coverage (film thickness on side wall/film thickness at top). Take note that the etch rate is expressed by a ratio relative to the etch rate of a standard thermal oxide film. As shown, the film thickness does not significantly change based on whether or not reforming is performed (the difference is 10% or less). There is no significant difference in coverage, either, based on whether or not reforming is performed. In the case of pulse PECVD (no reforming) in the comparative example, the WER became high and reached 10 times the WER of the thermal oxide film, or even higher, at 200° C. associated with good coverage. When the reforming process was implemented according to the present example, however, the WER dropped significantly and became as low as, or even lower than, the WER of the thermal oxide film even at 200° C. FIG. 4 shows the results of comparing the FTIR spectra of SIN films formed with and without reforming at a film forming temperature of 200° C. Clearly the film formed with reforming (W) has a higher SiN peak than the film formed without reforming (W/O), which indicates progress of nitriding at the film surface.

Example 2

A film was formed in the same manner as in Example 1, except that $NH_3$ was supplied (by 300 sccm) instead of $H_2$, in the reforming process. While the SiN film in Example 1 was obtained as a result of the reforming effect achieved by $H_2$ plasma, a similar reforming effect (low WER) was also achieved in the present example using NH₃ plasma instead of H₂ plasma.

Example 3

In accordance with Example 1, a film was formed by CVD using 4MS (tetramethyl silane) being the material and NH₃ at a film forming temperature of 550° C. and RF power of 50 W, after which a reforming cycle was implemented in which Ar was supplied (by 500 sccm) and RF power was applied. Examples of sequences are shown in FIG. 5 (7), (8). In (7), 600 W was applied when Ar was supplied, while in (6), 30 W was applied in the reforming cycle. While the WER at 1% HF was 60 nm/min without reforming cycle, it improved dramatically to 0.1 nm/min with reforming at 600 W and also to a plausible 1 nm/min with reforming at 30 W. In other words, good improvement characteristics could be achieved by using Ar gas. Similar results were also achieved when Xe gas was used. The difference in film thickness was 5% or less, when comparing the case of reforming process and the case of no reforming process. The WER improved significantly in a similar sequence at a film forming temperature of 100° C. Generally when a film formed at low temperature is exposed to atmosphere, the film reacts with water and other contents in air and its dielectric constant increases, refraction factor changes or film becomes otherwise unstable as a result. These undesirable situations could also be reduced by the aforementioned reforming process. The effects were confirmed by using Ar, Xe and N₂ as the treating gas.

Radio frequency plasma is applied to the shower head. This is because if radio frequency plasma is applied to the substrate side, the substrate will sustain damage due to plasma. Also, plasma of two different frequencies, such as 13.56 MHz and 400 kHz, may be applied because doing so has the effect of controlling the ions and thereby controlling the film quality.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a film for forming a layer of insulation film composed of multiple sub-layers of film on a substrate, comprising:
    (i) forming one or more sub-layers on the substrate by a film-forming cycle of plasma ALD or pulse plasma CVD using a precursor, each film-forming cycle using a plasma for forming a sub-layer of the same layer of insulation film;
    (ii) treating a surface of the one or more sub-layers on the substrate by a reforming cycle which is not included in the film-forming cycle, said reforming cycle using a plasma without using the precursor, for treating the surface of the one or more sub-layers, which plasma is selected from the group consisting of hydrogen plasma, ammonia plasma, oxygen plasma, nitrous oxide plasma, carbon dioxide plasma, argon plasma, and xenon plasma, except nitrogen plasma; and
    (iii) repeating steps (i) and (ii) until the layer of insulation film composed of multiple sub-layers is formed, wherein a purge cycle without RF power is provided between step (i) and (ii).

2. The method according to claim 1, wherein a purge cycle is provided between the film forming cycle and the reforming cycle in sequence.

3. The method according to claim 1, wherein a duration of each reforming cycle is 1 to 10 seconds.

4. The method according to claim 1, wherein in the reforming cycle, substantially no film is formed on the sub-layer.

5. The method according to claim 1, wherein the insulation film is constituted by a silicon compound.

6. The method according to claim 5, wherein the insulation film is SiO, SiN, SiCN, SiC, SiON, SiOCN, SiCN, SiBN or SiBO.

7. The method according to claim 1, wherein a precursor supplied in the film-forming cycle for forming the sub-layers is one or more types of material selected from the group consisting of aminosilane compounds and organic silane compounds.

8. The method according to claim 1, wherein the plasma is generated in the reforming cycle through application of radio frequency waves to a gap between capacitively-coupled parallel plate electrodes.

9. The method according to claim 8, wherein the plasma is generated, in the film-forming cycle and the reforming cycle, through the application of radio frequency waves to a shower head that serves as an upper electrode of the capacitively-coupled parallel plate electrodes and supplies gas.

10. The method according to claim 8, wherein two different radio frequencies are applied in the film-forming cycle and/or the reforming cycle.

11. The method according to claim 1, wherein the film-forming cycle is based on plasma ALD.

12. The method according to claim 1, wherein the film-forming cycle is based on pulsed plasma CVD.

13. The method according to claim 1, wherein the plasma is generated by applying a puke of RF power in the reforming cycle.

14. The method according to claim 1, Wherein the plasma is hydrogen plasma, ammonia plasma, nitrous oxide plasma, carbon dioxide plasma, argon plasma, and xenon plasma.

15. The method according to claim 1, wherein in the reforming cycle, the plasma is generated by supplying a treating gas and applying RF power, wherein a duration of time when the treating gas supply and RF application overlap is 1 to 3 seconds.

16. The method according to claim 1, wherein a plasma is applied to each reactant gas used in step (i).

17. The method according to claim 1, wherein RF power applied to generate a plasma in step (ii) is higher than RF power applied to generate a plasma in step (i).

18. The method according to claim 1, wherein a reactant gas used in step (i) is supplied continuously.

* * * * *